United States Patent
Jiang (10) Patent No.: US 8,598,872 B2
(45) Date of Patent: Dec. 3, 2013

(54) END FLANGE FOR A MAGNETIC RESONANCE IMAGING SYSTEM AND METHOD OF MANUFACTURING

(75) Inventor: Longzhi Jiang, Florence, SC (US)

(73) Assignee: General Electric Company, Schenectady, NY (US)

( * ) Notice: Subject to any disclaimer, the term of this patent is extended or adjusted under 35 U.S.C. 154(b) by 342 days.

(21) Appl. No.: 13/192,127

(22) Filed: Jul. 27, 2011

(65) Prior Publication Data

US 2013/0027039 A1 Jan. 31, 2013

(51) Int. Cl.
*G01V 3/00* (2006.01)

(52) U.S. Cl.
USPC ........................................... 324/307; 324/309

(58) Field of Classification Search
USPC ............................. 324/300–322; 600/407–445
See application file for complete search history.

(56) References Cited

U.S. PATENT DOCUMENTS

| | | | |
|---|---|---|---|
| 6,564,900 B1 | 5/2003 | Dean et al. | |
| 6,810,990 B2 | 11/2004 | Dean et al. | |
| 7,758,520 B2 | 7/2010 | Griffin et al. | |
| 8,163,003 B2 * | 4/2012 | Boyden et al. | 623/1.13 |
| 2008/0306377 A1 | 12/2008 | Piron et al. | |
| 2010/0256480 A1 | 10/2010 | Bottomley et al. | |
| 2010/0286566 A1 | 11/2010 | Griffin et al. | |
| 2011/0012698 A1 * | 1/2011 | Hutton et al. | 335/216 |
| 2011/0260727 A1 | 10/2011 | Punchard et al. | |
| 2011/0284191 A1 | 11/2011 | Jiang | |
| 2012/0149580 A1 * | 6/2012 | Hutton et al. | 505/211 |

FOREIGN PATENT DOCUMENTS

| | | |
|---|---|---|
| GB | 2444396 A | 6/2008 |
| JP | 61201994 A | 9/1986 |

OTHER PUBLICATIONS

Search Report from corresponding GB Application No. GB 1212921.9 dated Dec. 14, 2012.

* cited by examiner

*Primary Examiner* — Brij Shrivastav
(74) *Attorney, Agent, or Firm* — The Small Patent Law Group; Dean D. Small (57) ABSTRACT

An end flange for a magnetic resonance imaging (MRI) system and method for manufacturing an end flange are provided. One end flange is for a vacuum vessel of the MRI system. The vacuum vessel includes a housing configured to receive therein a magnet assembly and an end flange forming an end of the housing. The flange includes an outer surface, an inner surface, and a core coupled between the outer and inner surfaces, wherein the core has a greater stiffness than the outer surface and the inner surface.

20 Claims, 6 Drawing Sheets

END FLANGE FOR A MAGNETIC RESONANCE IMAGING SYSTEM AND METHOD OF MANUFACTURING

BACKGROUND OF THE INVENTION

The subject matter disclosed herein relates generally to cryogenically cooled magnetic resonance imaging (MRI) systems, and more particularly to end flanges for a vacuum vessel of the MRI systems.

In superconducting coil MRI systems, the coils forming the superconducting magnets are cryogenically cooled using a helium vessel. The cryogen cooling system of some of these MRI systems may continually cool the superconducting magnet coils during system operation. Additionally, a thermal shield may be provided, which is typically positioned within a vacuum vessel between the vacuum vessel and the helium vessel.

Conventional flanges for the vacuum vessel of MRI systems have to be formed as thick metal structures for supporting the components therein. The thick metal flanges add cost and weight to the overall MRI system. Moreover, a cover is typically provided over the end flanges with a gap therebetween. Thus, for a given footprint for the MRI system, a shorter coil length for the superconducting magnet assembly results due to the spacing created by the gap. This shorter coil length results in a reduced Electromagnetic (EM) envelope.

BRIEF DESCRIPTION OF THE INVENTION

In accordance with various embodiments, a vacuum vessel for a magnetic resonance imaging (MRI) system is provided. The vacuum vessel includes a housing configured to receive therein a magnet assembly and an end flange forming an end of the housing. The flange includes an outer surface, an inner surface, and a core coupled between the outer and inner surfaces, wherein the core has a greater stiffness than the outer surface and the inner surface.

In accordance with other embodiments, a magnet system for a magnetic resonance imaging (MRI) device is provided. The magnet system includes a vacuum vessel having at least one end flange formed from a non-solid core having outer and inner surfaces forming planar walls. The non-solid core has a greater stiffness than the outer and inner surfaces. The magnet system also includes a cryogen vessel having liquid helium therein, with the cryogen vessel within the vacuum vessel. The magnet system further includes a superconducting magnet within the cryogen vessel.

In accordance with yet other embodiments, a method of manufacturing a flange for a vacuum vessel for a magnet resonance imaging (MRI) system is provided. The method includes forming a core, an outer surface and inner surface of a vacuum vessel flange, wherein the core has a greater stiffness than the outer surface and the inner surface. The method also includes coupling together the core with the outer and inner surfaces, wherein the core is between the outer and inner surfaces and together defines a generally planar vacuum vessel flange.

DETAILED DESCRIPTION OF THE INVENTION

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide one or more end flanges for a vacuum vessel of a magnetic resonance imaging (MRI) system. In some embodiments, the end flanges are formed as a multi-material structure having a core formed from a material different than outer and inner surfaces of the end flanges. In other embodiment, the core has a different structure than the outer and inner surfaces. By practicing at least one embodiment, the overall length of the MRI magnet may be shortened or the Electromagnetic (EM) envelope may be increased if the magnet length remains the same. By also practicing at least one embodiment, the cover for a magnet assembly may not be needed and the acoustic noise of the MRI system may be reduced.

Figure 1:
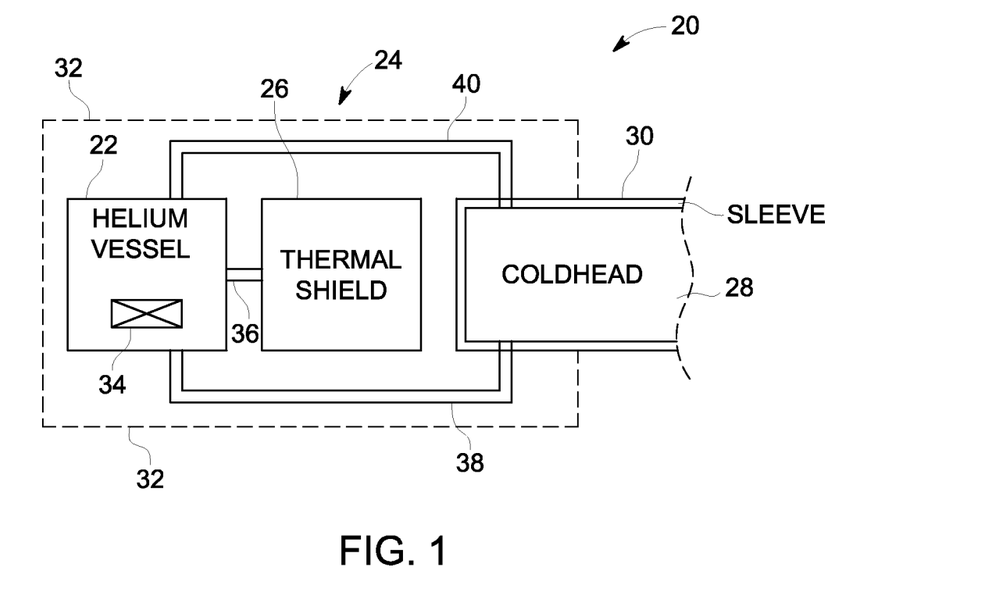
FIG. 1 is a simplified block diagram of magnetic resonance imaging (MRI) magnet system formed in accordance with an embodiment.

FIG. 1 is a simplified block diagram of an MRI magnet system 20 formed in accordance with various embodiments. The MRI magnet system 20 includes a vessel 22 that holds a liquid cryogen, such as liquid helium. Thus, in this embodiment, the vessel 22 is a helium vessel, which also may be referred to as a helium pressure vessel. The vessel 22 is surrounded by a vacuum vessel 24 and includes a thermal shield 26 therein and/or therebetween. The thermal shield 26 may be, for example, a thermally isolating radiation shield. The vacuum vessel 24 includes one or more end flanges 32 located at one or more ends thereof, which may be at ends of a magnet assembly, which includes the helium vessel 22. The end flanges 32 in various embodiments include a core and outer and inner surfaces formed from different materials or structures as described in more detail herein.

A coldhead 28, which in various embodiments is a cryocooler, extends through the vacuum vessel 24 within a coldhead sleeve 30 (e.g., a housing). Thus, the cold end of the coldhead 28 may be positioned within the coldhead sleeve 30 without affecting the vacuum within the vacuum vessel 24. The coldhead 28 is inserted and secured within the coldhead sleeve 30 using any suitable means, such as one or more flanges and bolts, or other means known in the art. Moreover, a motor 42 (shown in FIG. 2) of the coldhead 28 is provided outside the vacuum vessel 24.

One or more magnet coils 34, which in various embodiments form a superconducting magnet, are provided inside the helium vessel 22 and are controlled during operation of the MRI system as described in more detail herein to acquire MRI image data. Additionally, during operation of the MRI system, liquid helium within the helium vessel 22 of the MRI magnet system 20 cools the superconducting magnet coils 34. The superconducting magnet coils 34 may be cooled to a superconducting temperature, for example, 4.2 Kelvin (K). The cooling process may include the recondensing of boiled off helium gas to liquid by a helium recondensing system (not shown in FIG. 1) and returned to the helium vessel 22. It should be noted that the boiled off helium may pass through a gas passageway 36 that connects the helium vessel 22 to the thermal shield 26. The passage of the helium gas from the gas passageway 36 to the thermal shield 26 acts to cool the thermal shield 26. The cooling system also includes gas passageways 38 and 40 (e.g., tubes) that connect the helium vessel 22 to the coldhead 28 to cool the cryogen.

Figure 2:
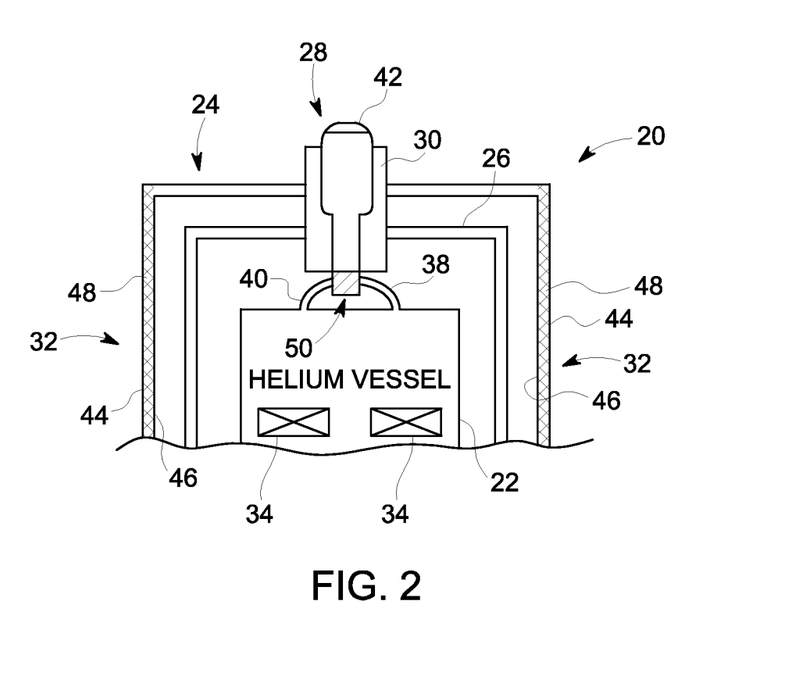
FIG. 2 is a cross-sectional view of an MRI magnet system illustrating end flanges formed in accordance with various embodiments.

In various embodiments, for example as illustrated in FIGS. 1 and 2, the gas passageway 38 and gas passageway 40, respectively, operate to transfer or communicate helium gas from the helium vessel 22 to circulate boiled off helium gas to and from the coldhead 28. Additionally, the passageway 36 operates to transfer or communicate helium gas from the helium vessel 22 to circulate helium gas (e.g., boiled off helium gas) from the helium vessel 22 in or at the thermal shield 26, for example, during normal operation or during a power off condition of the coldhead 28. It should be noted that any coupling arrangement or means for transferring the helium to and from the helium vessel 22 may be used.

Thus, the coldhead 28, which in various embodiments is a cryocooler, extends through the vacuum vessel 24 within the coldhead sleeve 30 (e.g., a housing) with the motor 42 of the coldhead 28 provided outside the vacuum vessel 24. The cooling process may include the recondensing of boiled off helium gas to liquid by a helium recondensing system 50 and returned to the helium vessel 22. It should be noted that the boiled off helium may pass through the gas passageway 38 that connects the helium vessel 22 to a recondensing system 50 and the recondensed helium may be returned to the helium vessel through the passageway 40.

FIG. 2 is a cross-sectional view of a portion of the MRI magnet system 20 illustrating the vacuum vessel 24 with end flanges 32 formed in accordance with various embodiments. It should be noted that like numerals represent like or similar parts throughout the Figures. As shown, the helium vessel 22 is surrounded by the vacuum vessel 24 and includes the thermal shield 26 therein and/or therebetween, which thermal shield may be, for example, a thermally isolating radiation shield.

The end flanges 32 of the vacuum vessel 24 include an outer surface 44 and an inner surface 46 that generally define portions of outer and inner walls, respectively, of the vacuum vessel 24. The outer surface 44 is generally the surface that is exposed to the environment or atmosphere (e.g., visible to an operator) and the inner surface 46 defines the inside surface of the vacuum vessel 24 along the end flanges 32. The end flanges 32 include a core 48 between the outer and inner surfaces 44 and 46. Thus, the core 48 in various embodiments is sandwiched between the outer and inner surfaces 44 and 46. In one embodiment, the core 48 is formed from a material or structure (e.g., a non-solid core with solid outer and inner surfaces 44 and 46) that is different than the outer and inner surfaces 44 and 46. Additionally, the outer and inner surfaces 44 and 46 may be formed from the same or different materials.

Figure 3:
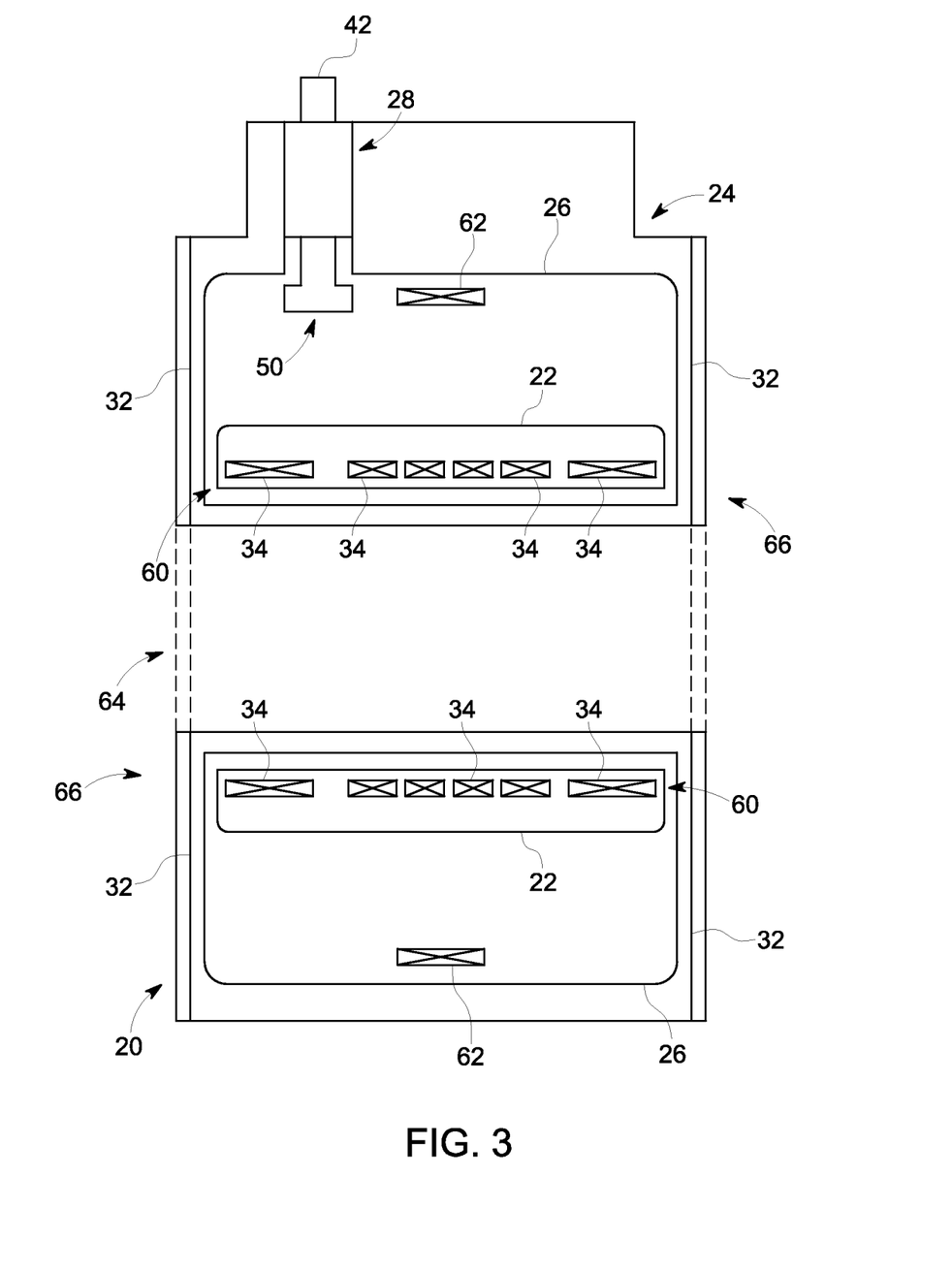
FIG. 3 is a simplified diagram illustrating a vacuum vessel with flanges formed in accordance with various embodiments.

One configuration of the MRI magnet system 20 is illustrated in FIG. 3, which is a simplified illustration showing the various housings, the superconducting magnet coils 34 and the coldhead 28. In this embodiment, the MRI magnet system 20 includes a superconducting MRI magnet 60 formed from concentric superconducting main coils 34 and bucking coils 62 supported, for example, inside cylindrical shells (e.g., one or more coil support shells) of high thermal conductivity, and cooled by the coldhead 28 that operates as cryorefrigerator system.

The superconducting coils 34 and/or 62 in various embodiments are molded with epoxy resin. For example, the molded coils may be wound with wet epoxy and cured to form self-supporting structures. The superconducting coils 34 and/or 62 then may be bonded to the coil support shells. The formed superconducting coils 34 and/or 62 are sized to define a bore 64 therethrough which is used to image an object (e.g., a patient). For example, a field of view (FOV) may be defined to image a particular portion of the object as described in more detail herein.

Figure 4:
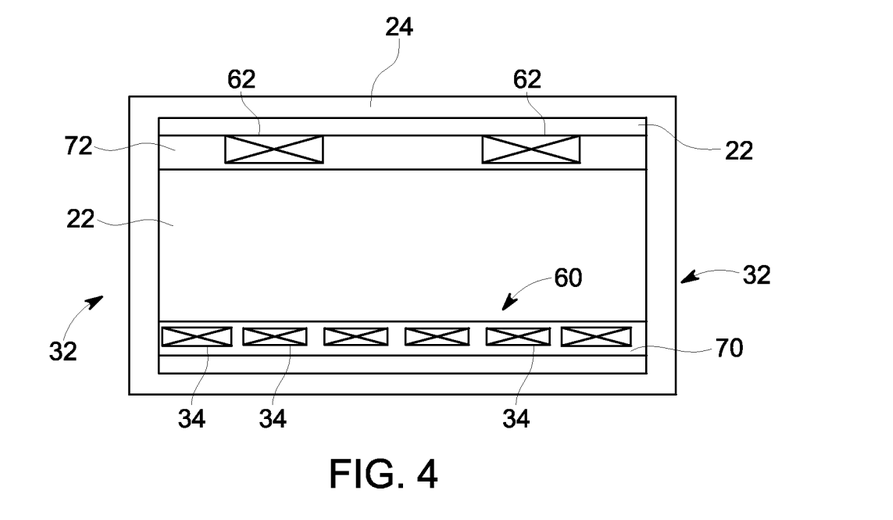
FIG. 4 is a simplified block diagram illustrating a vacuum vessel with flanges formed in accordance with various embodiments.

As can be seen, the vacuum vessel 24 includes generally planar outer walls 66, which include the end flanges 32 that are likewise generally planar or flat. One embodiment is shown in FIG. 4 wherein the helium vessel 22 includes therein one or more coils that form the magnet 60. For example, the plurality of coils 34 may be supported and maintained on a former 70 (e.g., a main magnet former), and the plurality of coils 62 may be supported and maintained on a former 72 (e.g., a secondary former). The formers 70 and 72 may be any suitable formers capable of supporting and maintaining coils for a superconducting magnet. In one embodiment, the coils 34 are main magnet coils and the coils 62 are bucking or shield coils. The number and positioning of the coils 34 and 62 may be varied as desired or needed.

The coils 34 and 62 are immersed in liquid helium contained with the helium vessel 22. In this embodiment, the vacuum vessel flanges 32 are formed from a thinner structure as described in more detail below. For example, in one embodiment, the vacuum vessel flanges 32 are formed from multiple materials and/or multiple structures or configurations having an overall thickness of about 10 millimeters (mm), wherein the outer and inner surfaces 44 and 46 are each about 2 mm in thickness.

Figure 5:
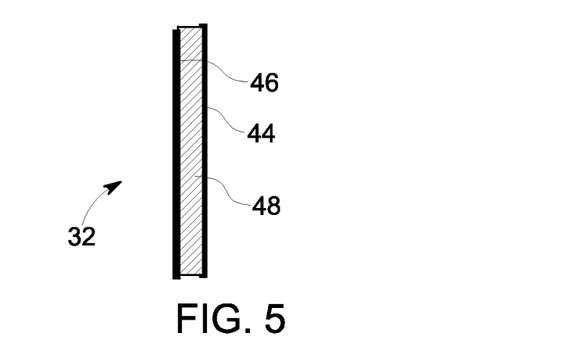
FIG. 5 is a cross-sectional view of a portion of a vacuum vessel flange formed in accordance with an embodiment.

In various embodiment, as shown in FIG. 5, the outer and inner surfaces 44 and 46 are formed from a material having a higher bending modulus (or module of elasticity) than the core 48 and the core 48 is formed from a material or structure having a higher shear modulus (or modulus of rigidity) that the outer and inner surfaces 44 and 46. It should be noted that in some embodiments, the core 48 and the outer and inner surfaces 44 and 46 are formed from the same material, but having different thickness or structures to affect the properties of each. Thus, in the various embodiments, the rigidity of the flange 32 is defined primarily by the structure of the core 48 with the outer and inner surfaces 44 and 46 defining a covering or housing for the rigid core.

In one embodiment, the outer and inner surfaces 44 and 46 are formed from a sheet or layer of metal, for example, a 2 mm thick layer of stainless steel or other suitable metal. However, non-metal materials may be used to form at least one of the outer or inner surfaces 44 and 46. For example, in one embodiment, the outer surface 46, which is the visible surface, is formed from a fiberglass material or other reinforced polymer. In some embodiments, a carbon fiber based material may be used. When the outer surface 46 is formed from fiberglass or a similar material having a finished appearance, an additional cover (for aesthetic appearance of the MRI magnet system 20) is not provided. Thus, the outer surface 46 forms the outermost surface of the MRI magnet system 20, which is the visible housing of the MRI magnet system 20.

In some embodiments, the core 48 is formed from a composite material. The composite material is generally formed from a substrate and a resin. The composite material also may be fiber reinforced. For example, the core 48 may be formed from a carbon-fiber reinforced plastic or a glass-reinforced plastic. The composite material also may include metal fibers that reinforce other metals, such as in a metal matrix composite. Other non-metal composites may be used an include, for example, ceramic matrix composites and thermoplastic composites. Thus, in various embodiments, the core 48 may be formed from a high density composite.

Figure 6:
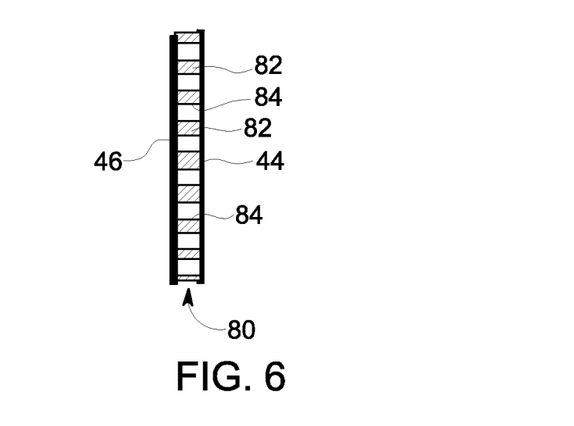
FIG. 6 is a cross-sectional view of a portion of a vacuum vessel flange formed in accordance with another embodiment.
Figure 7:
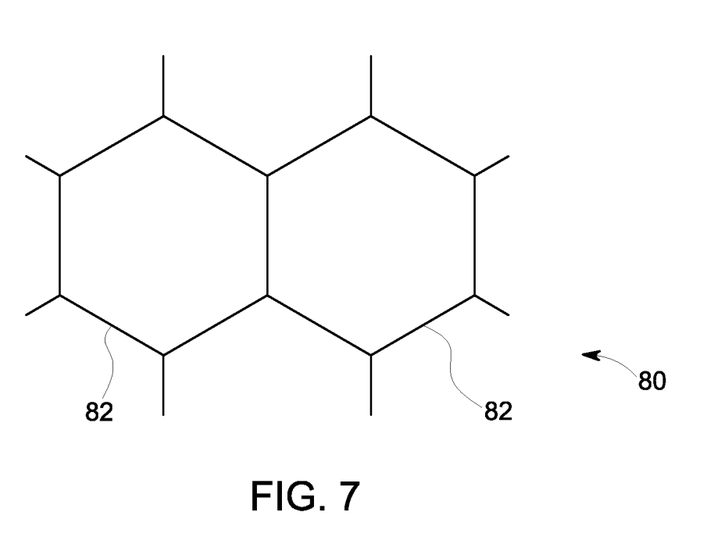
FIG. 7 is a plan view of a portion of a core of the vacuum vessel flange of FIG. 6.
Figure 8:
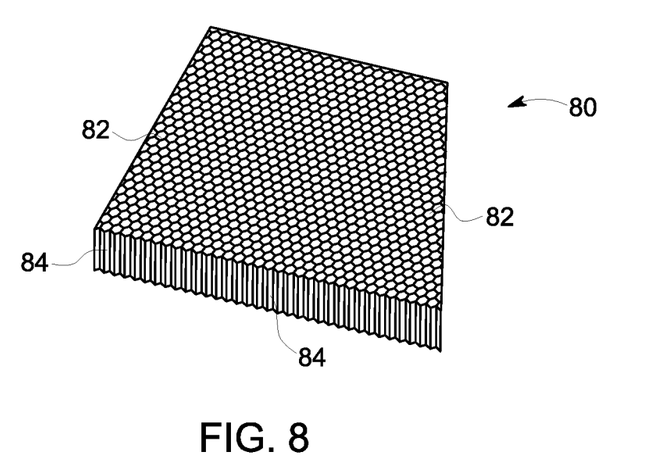
FIG. 8 is a perspective view of a portion of a core of the vacuum vessel flange of FIG. 6.

In some embodiments, the core 48 is formed from a metal material that is not a solid structure. In these embodiments, the outer and inner surfaces 44 and 46 may be formed from a metal material or a non-metal material. The core 48 is defined by a structure that in one embodiment includes a honeycomb type configuration 80 as shown in FIGS. 6 through 8 having a plurality of hexagonal cells 82. The geometry of the honeycomb type configuration 80 structure can vary and is illustrated as an array of hollow hexagonal cells 82 (as shown in FIG. 8) separated by walls 84, which may be, for example, thin vertical walls (e.g., walls having a thickness of about 1-5 mm). The hexagonal cells 82 in this embodiments are columnar. However, it should be noted that the cells 82 may be formed in different shapes other than hexagons, for example, diamond shaped or octagonal shaped, among others. In general, the core in these embodiments is formed from a structure that provides a material with reduced or minimal density and relatively high out-of-plane compression properties and out-of-plane shear properties as described herein. For example, using the honeycomb type configuration 80, in some embodiments a shear modulus increase of about four times is provided using about one-quarter of the material (as compared with a solid core).

It should be noted that the various materials forming the components or layers of the flange 32 may be selected to have additional properties that may be desirable or required. For example, the outer surface 44 may be formed from a material that provides Underwriters Laboratories (UL) flammability requirement compatibility for an MRI application. Alternatively, the outer surface 44 may be coated, for example, with a layer of UL flammability resistant material.

The various components of the flanges 32, including the outer and inner surfaces 44 and 46, and the core 48 may be coupled together using any suitable fastening means. For example, the various components may be mechanically fastened together, such as using screws or bolts. As other examples, an adhesive or glue, such as an epoxy may be used. Still other examples include, for example, welding the various components together.

Thus, the flange 32 in various embodiments is formed from a sandwiched or layered structure (e.g., a multi-layer structure), wherein a sandwich type composite structure enables the flanges 32 to be thinner and provide the same or similar characteristics or properties, for example, the same or similar support as a solid flange. In the various embodiments, the material of the core 48 provides increase rigidity or stiffness allowing the outer and inner surfaces 44 and 46 to be formed from materials having less rigidity and/or less thickness.

Figure 9:
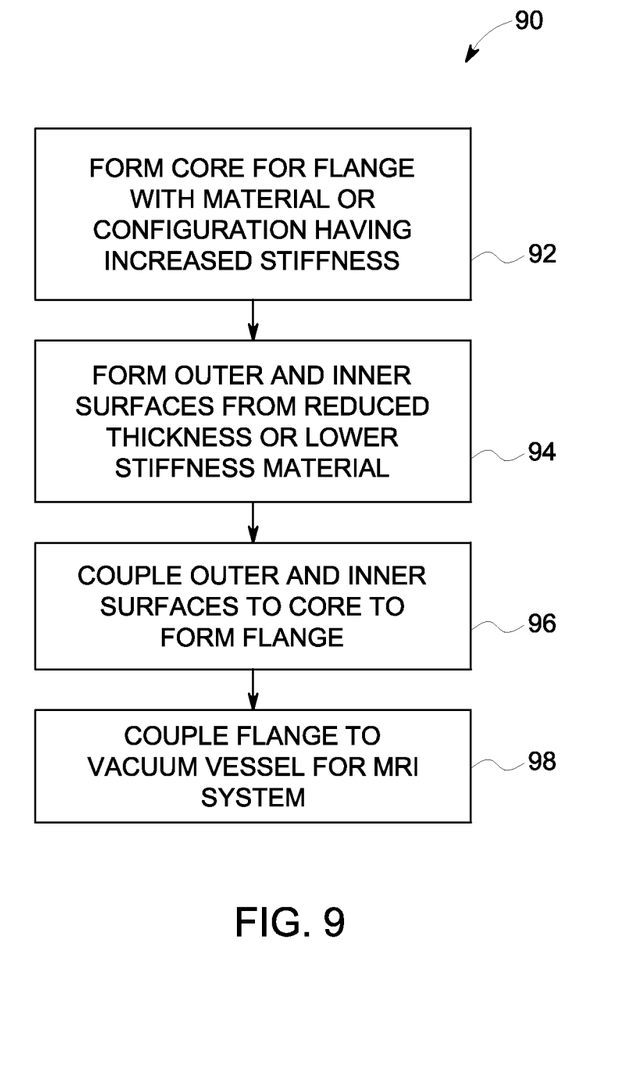
FIG. 9 is a flowchart of a method for manufacturing a flange for a vacuum vessel for an MRI system in accordance with various embodiments.

Various embodiments also provide a method 90 as shown in FIG. 9 for manufacturing a flange for a vacuum vessel for an MRI system. The method includes at 92 forming a core for the flange with a material or having a configuration that provides increased rigidity or stiffness. As described herein, the core may be formed from a material selected to provide increased rigidity or stiffness, or provided in a configuration (e.g., honey comb shaped) having increased rigidity or stiffness. For example, the core may be formed to have a high shear modulus, for example, above 75 GPa. In some embodiments, the core may be formed having a shear modulus about or at least as high as steel, which has a shear modulus of about 79.3 GPa.

The method also includes at 94 forming outer and inner surfaces from a reduced thickness or lower stiffness material. For example, in one embodiment, the outer and inner surfaces are formed from a thin layer of metal, for example, from a stainless steel material having a thickness of about 2 mm.

The core and the outer and inner surfaces are then coupled together at 96 to form the end flange for the vacuum vessel. The components may be coupled together using any suitable means as described herein. The outer and inner surfaces generally define outer and inner walls of the end flange with the tore therebetween defining the body of the end flange.

The end flange is then coupled to a vacuum vessel for an MRI system at 98. For example, the end flange may be coupled to the vacuum vessel sides using any suitable coupling means.

It should be noted that although some embodiments may be described in connection with end flanges for vacuum vessels for an MRI system having superconducting magnets, the various embodiments may be implemented in connection with any type of system having superconducting magnets. The superconducting magnets may be implemented in other types of medical imaging devices, as well as non-medical imaging devices. Moreover, the various embodiments may be implemented in connection with other types of MRI systems.

Thus, the various embodiments may be implemented in connection with vacuum vessels for different types of MRI systems. For example, the various embodiments may be implemented with the MRI system 100 shown in FIG. 10. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a computed tomography (CT), positron emission tomography (PET), a single photon emission computed tomography (SPECT), as well as an ultra-sound system, or any other system capable of generating images, such as of a human. Moreover, the various embodiments are not limited to medical imaging systems for imaging human subjects, but may include veterinary or non-medical systems for imaging non-human objects, luggage, etc.

Figure 10:
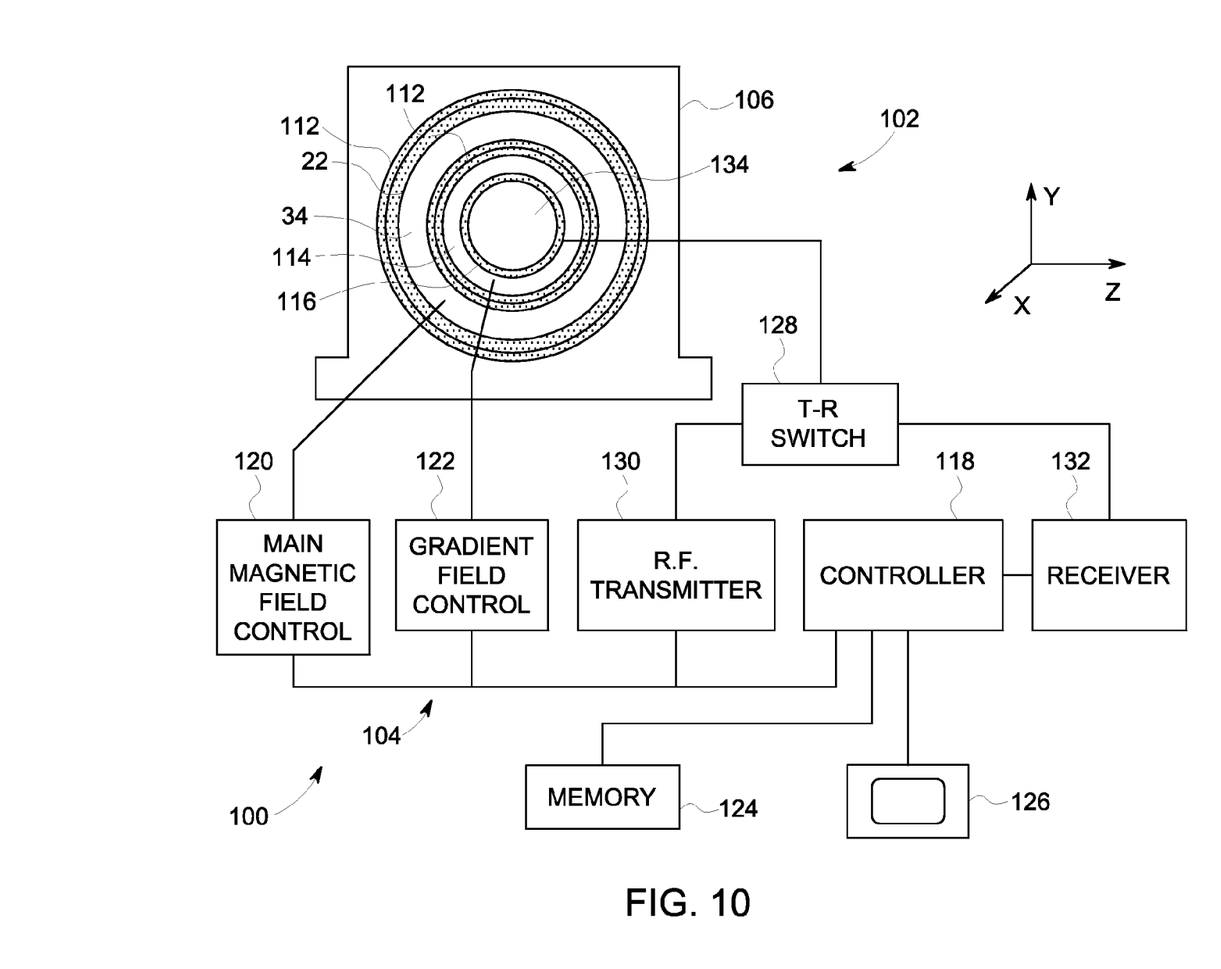
FIG. 10 is a block diagram of an MRI system in which a vacuum vessel flange formed in accordance with various embodiments may be implemented.

Referring to FIG. 10, the MRI system 100 generally includes an imaging portion 102 and a processing portion 104 that may include a processor or other computing or controller device. The MRI system 100 includes within a gantry 106 superconducting magnet coils 34, which may be supported on a magnet coil support structure. The helium vessel 22 (also referred to as a cryostat) surrounds the superconducting magnet coils 34 and is filled with liquid helium. The liquid helium may be used to cool a coldhead sleeve and/or a thermal shield as described in more detail herein. The vacuum vessel 24 surrounds the helium vessel 22 and includes the end flanges 32 as described herein and shown in FIGS. 1 through 8.

Thermal insulation 112 is provided surrounding the outer surface of the helium vessel 22 and the inner surface of the superconducting magnet coils 34. A plurality of magnetic gradient coils 114 are provided inside the superconducting magnet coils 34 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet coils 34 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet coils 34 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet coils 34.

The magnetic gradient coils 114, which include one or more gradient coil elements, are provided so that a magnetic gradient can be imposed on the magnetic field $B_o$ in the bore 134 within the superconducting magnet coils 34 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A vacuum vessel for a magnetic resonance imaging (MRI) system, the vacuum vessel comprising:
    a housing configured to receive therein a magnet assembly; and
    an end flange forming an end of the housing, wherein the end flange include an outer surface, an inner surface, and a core coupled between the outer and inner surfaces, the core having a greater stiffness than the outer surface and the inner surface.

2. The vacuum vessel of claim 1, wherein the end flange is generally planar.

3. The vacuum vessel of claim 1, wherein the outer and inner surfaces are formed from a metal material and the core is formed from a composite material.

4. The vacuum vessel of claim 3, wherein the metal material is stainless steel.

5. The vacuum vessel of claim 3, wherein the metal material has a thickness of about two millimeters.

6. The vacuum vessel of claim 1, wherein the outer and inner surfaces are formed from fiberglass.

7. The vacuum vessel of claim 1, wherein the core is formed from a metal in a honeycomb type configuration.

8. The vacuum vessel of claim 7, wherein the metal is aluminum.

9. The vacuum vessel of claim 1, wherein the outer surface comprises a flammability resistant material.

10. The vacuum vessel of claim 1, wherein the outer surface defines an outer housing of the vacuum vessel and not including a cover.

11. The vacuum vessel of claim 1, wherein the outer surface, the inner surface, and the core are coupled together in a sandwiched arrangement and having an overall thickness of about ten millimeters.

12. A magnet system for a magnetic resonance imaging (MRI) device, the magnet system comprising:
    a vacuum vessel having at least one end flange formed from a non-solid core having outer and inner surfaces forming planar walls, the non-solid core having a greater stiffness than the outer and inner surfaces;
    a cryogen vessel having liquid helium therein, the cryogen vessel within the vacuum vessel; and
    a superconducting magnet within the cryogen vessel.

13. The magnet system of claim 12, wherein the outer and inner surfaces are formed from a metal material and the non-solid core is formed from a composite material.

14. The magnet system of claim 13, wherein the metal material is stainless steel and has a thickness of about two millimeters, and the outer surface, the inner surface, and the core are coupled together in a sandwiched arrangement and having an overall thickness of about ten millimeters.

15. The magnet system of claim 12, wherein the outer and inner surfaces are formed from fiberglass.

16. The magnet system of claim 12, wherein the non-solid core is formed from a metal in a honeycomb type configuration.

17. The magnet system of claim 12, wherein the outer surface comprises a flammability resistant material.

18. The magnet system of claim 12, wherein the outer surface defines an outer housing of the vacuum vessel and not including a cover.

19. A method of manufacturing a flange for a vacuum vessel for a magnet resonance imaging (MRI) system, the method comprising:
    forming a core, an outer surface and inner surface of a vacuum vessel flange, the core having a greater stiffness than the outer surface and the inner surface; and
    coupling together the core with the outer and inner surfaces, the core between the outer and inner surfaces and together defining a generally planar vacuum vessel flange.

20. The method of claim 19, wherein the outer and inner surfaces are formed from a metal material and the core is formed from a composite material, the core coupled together in a sandwiched arrangement with the outer and inner surfaces and having an overall thickness of about ten millimeters.

\* \* \* \* \*